| (12) | United States Patent | (10) Patent No.: | US 7,265,548 B2 |
|---|---|---|---|
| | Böttcher | (45) Date of Patent: | Sep. 4, 2007 |

(54) MR METHOD FOR MINIMIZING THE CHEMICAL SHIFT ARTIFACT, USING A LOCALIZED SPATIALLY DEPENDENT SATURATION PULSE

(75) Inventor: Uwe Böttcher, Uttemeuth (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/387,175

(22) Filed: Mar. 23, 2006

(65) Prior Publication Data

US 2006/0220643 A1 Oct. 5, 2006

(30) Foreign Application Priority Data

Mar. 29, 2005 (DE) .................. 10 2005 014 216

(51) Int. Cl.
*G01V 3/00* (2006.01)
(52) U.S. Cl. ...................... 324/309; 324/307
(58) Field of Classification Search ........ 324/300–322; 600/410–445
See application file for complete search history.

(56) References Cited

U.S. PATENT DOCUMENTS 6,304,084 B1 * 10/2001 Star-Lack et al. ........... 324/307
6,489,764 B2 * 12/2002 Yamazaki et al. .......... 324/307
6,781,373 B2 * 8/2004 Gurr ........................... 324/307
7,042,214 B2 * 5/2006 Cunningham et al. ...... 324/307

FOREIGN PATENT DOCUMENTS

EP 1 022 576 7/2000

OTHER PUBLICATIONS

"BISTRO: An Outer-Volume Suppression Method That Tolerates RF Field Inhomogeneity," Luo et al, Magnetic Resonance in Medicine, vol. 45 (2001), pp. 1095-1102.
"Dualband Spectral-Spatial RF Pulses for Prostate MR Spectroscopic Imaging," Schricker et al, Magnetic Resonance in Medicine, vol. 46 (2001) pp. 1079-1087
"Fat Suppression in MR Imaging: Techniques and Pitfalls," Delfaut et al, Radio-Graphics vol. 19 (1999) pp. 373-382.

* cited by examiner

*Primary Examiner*—Brij Shrivastav
(74) *Attorney, Agent, or Firm*—Schiff Hardin LLP

(57) ABSTRACT

In a method for switching a localized saturation pulse in magnetic resonance spectroscopy or magnetic resonance imaging, magnetic field gradients are switched during the saturation pulse, with the steps of establishing the examination region, establishing the position of the saturation pulse relative to the examination region, determining the spectral position of the signal to be saturated, and selecting the magnetic field gradients dependent on the position of the saturation pulse relative to the examination region and dependent on the spectral position of the signal to be saturated.

5 Claims, 4 Drawing Sheets

MR METHOD FOR MINIMIZING THE CHEMICAL SHIFT ARTIFACT, USING A LOCALIZED SPATIALLY DEPENDENT SATURATION PULSE

BACKGROUND OF THE INVENTION

1. Field of the Invention

The present invention concerns a method for switching regional saturation pulses in magnetic resonance spectroscopy and magnetic resonance imaging. The present invention is particularly applicable where signal portions that are of interest in the examination could also be saturated in addition to the saturated signal upon the application of a saturation pulse.

2. Description of the Prior Art

Localized (targeted) saturation pulses are used for suppression of unwanted signals in magnetic resonance spectroscopy. The spatial extent of the saturation range can be established by the application of a magnetic field gradient and by selection of the frequency of the saturation pulse. Dependent on the spatial relation of these saturation pulses relative to the examination region (volume of interest, VOI), the signal portions of compounds that are actually of interest in the examination, but are partially or completely suppressed in the data acquisition due to the switching of the saturation pulses, can also be suppressed due to the chemical shift artifact.

The phenomenon known as the chemical shift is the property utilized in spectroscopy that the resonance frequency shifts slightly (proportional to the magnetic field strength) dependent on the type of chemical compound in which the precessing nucleus is located. Due to the switching of magnetic field gradients during the saturation pulses, the position of the saturated region depends on the chemical shift. For example, for a saturation pulse with a predetermined bandwidth, the position of the saturated water portions differs from the position of the saturated fat portions since a difference in the resonant frequency of approximately 3.7 ppm (parts per million) exists between fat and water.

Due to the different position of the saturation region for various chemical compounds, it can now occur that signals of nuclei of interest in the examination region can also be suppressed given selection of a saturation region in addition to the examination region. This effect increases with the chemical shift and is particularly pronounced when long saturation pulses or pulses with small bandwidths must be used, which occurs with the use of high magnetic fields and excitation with large coils. This unwanted saturation makes the evaluation of the data in the affected regions impossible.

EP 1 022 576 A1 describes a method for fat suppression in which the fat signal is suppressed by a CHESS pulse sequence, wherein the optimal flip angle is calculated.

U.S. Pat. No. 6,304,084 discloses the use of 180° pulses after a 90° pulse in order to reduce the chemical shift artifact.

It has been previously attempted to minimize this problem by using saturation pulses with high bandwidths and rectangular slice profiles. A disadvantage of this approach is that very high voltages, the generation of which is costly, are required for generation of such RF pulses.

SUMMARY OF THE INVENTION

An object of the present invention is, in magnetic resonance imaging and/or spectroscopy, to enable the application of regional saturation pulses in which signal portions that are of interest in the examination are not saturated in the examination region.

This object is achieved in accordance with the invention by a method for switching a regional saturation pulse wherein, in a first step, the examination region is established in which an investigation is to be made by magnetic resonance spectroscopy or tomography. The position of the saturation pulse is subsequently established relative to the examination region. It must be established where the saturation region for suppression of unwanted signals lies relative to the examination region. Furthermore, the spectral position of the signal to be saturated must be subsequently established. When the position of the saturation pulse relative to the examination region and the spectral position of the signal to be saturated are now known, the magnetic field gradient is selected dependent on the position of the saturation pulse relative to the examination region and dependent on the spectral position of the signal to be saturated. By the selection of the magnetic field gradients, the inventive method prevents signal portions that are of interest in the examination from being saturated in the examination region.

In a preferred embodiment of the invention, the spectral position of the signal to be saturated is determined relative to the signal portions of interest, and the magnetic field gradient is switched such that signal portions of interest are also excited by the saturation pulse in addition to the signal to be saturated by switching the saturation pulse and the magnetic field gradient. The magnetic field gradient, however, is switched such that the saturated signal portions of interest lie spatially further removed from the examination subject than the signal portions of the signal to be saturated.

In order to cause the signal portions of interest to lie further removed from the examination region than the signal portions of the signal to be saturated, the polarity of the magnetic field gradient is selected dependent on the position of the saturation pulse relative to the examination region and dependent on the spectral position of the signal to be saturated.

In many application fields, the signal to be saturated is the fat signal that should be suppressed by switching a saturation pulse with a magnetic field gradient. In the human body, the fat signal can be present with a distinctly higher proportion than the signals of interest in the magnetic resonance spectroscopy, such as lactate, choline, creatine or NAA. In order to suppress the signal influence of the fat of the examined tissue that is possibly located in the proximity of the examination region, fat saturation regions are selected at the edges of the examination region. The polarity of the magnetic field gradient is selected such that the saturated regions of the signal portions of interest lie further removed from the examination region than the saturated regions of the fat signal. It thus can be achieved that the saturated regions of the signals of interest always lie outside of the volume of interest (VOI).

The present invention is naturally not limited to proton imaging; applications with other nuclei (such as, for example, phosphorus, sodium or carbon) that can be examined by means of nuclear magnetic resonance are also possible. They can also be applied given non-proton spectroscopy.

In general, by selection of the polarity of the magnetic field gradient the signal portions of interest can be made to lie further removed from the examination region than the saturated regions of the suppressed signal when the signals to be suppressed lie at one end of the spectrum and the signals of interest lie at another end. For example, in the case of fat this is possible since the metabolites of interest spectrally lie on one side of the spectrum while the fat signal is located on the edge of the other side of the spectrum.

In the fat saturation, the polarity of the magnetic field gradient is selected such that, when the saturation region lies at a first side of the examination region, the overall magnetic field (composed of the magnetic field gradient and the basic magnetic field) increases at this first side. The signals of the nuclei of interest have a higher resonant frequency than the fat signal. If the fat saturation region is now placed on the left or right side of the examination region, the total magnetic field must increase at the left or right side since the saturated regions of the signal portions of interest thereby lie further removed from the examination region than the saturated fat signal portions.

DESCRIPTION OF THE PREFERRED EMBODIMENTS

Figure 1A:
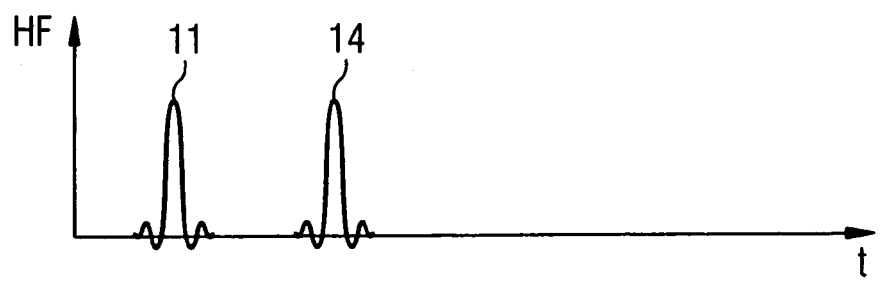
FIGS. 1A through 1D illustrate the switching of the saturation pulses according to the prior art (1A and 1B) and according to the invention (1C and 1D).
Figure 1B:
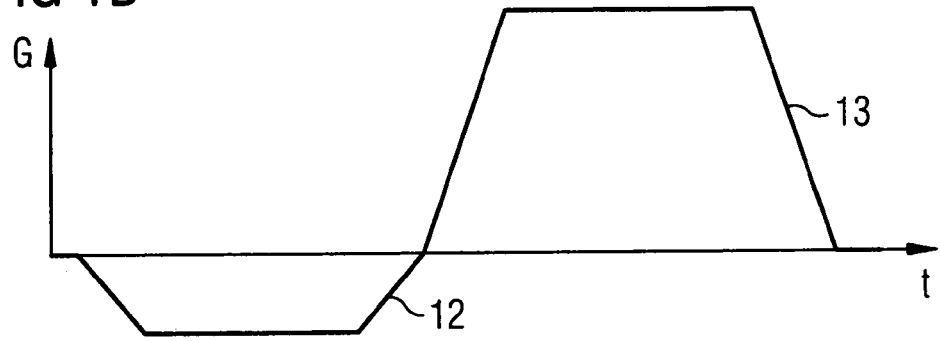

FIGS. 1A and 1B show a diagram for switching regional saturation pulses according to the prior art. In the implementation of an imaging MR spectroscopy measurement in an examination region 20 (FIG. 2), fat saturation regions 21, 22 are selected in addition to the examination region 20 in order to suppress the fat signal in the saturation regions 21, 22. As is shown in FIGS. 1A and 1B, for this purpose a first radio-frequency pulse 11 is switched (activated) while a magnetic field gradient 12 is simultaneously switched. The strength of the magnetic field gradient 12 and the frequency of the saturation pulse 11 are selected such that, for example, the fat signals are excited in the saturation region 21. Due to the subsequent spoiler gradient 13, the signal portions of the fat are dephased such that the fat signal yields no signal portion in the acquired MR spectrum. For a fat saturation in the region 22, a second saturation pulse 14 with another frequency is then switched during the switching of the same magnetic field gradient 12 in order to suppress the fat signal in the region 22.

Figure 2:
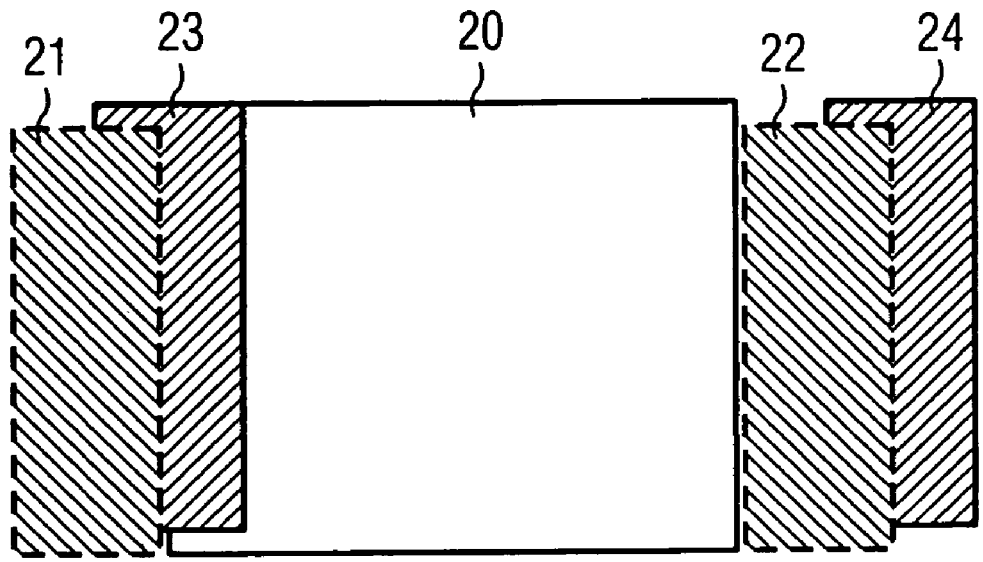
FIG. 2 shows the effect of nuclei of interest in the examination region being saturated by selection of a saturation region when the magnetic field gradient is selected according to the prior art.

Due to the chemical shift of, for example, creatine relative to fat, the signal portions for creatine are saturated in a region 23. As can be seen in FIG. 2, however, a part of the saturated region 23 lies in the examination region 20, which can adulterate the subsequent spectroscopy measurement since the creatine signal in the examination region is already saturated.

Given selection of the same gradient during the second saturation pulse 14, the saturation region for creatine 24 now lies further removed from the examination region 20 such that it does not lead to suppression of signals of interest in the examination region 20.

Figure 1C:
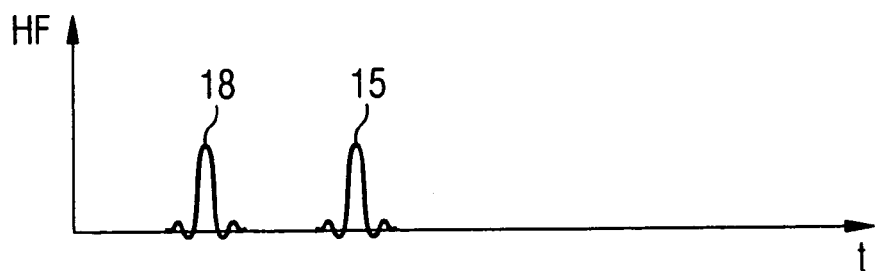
Figure 1D:
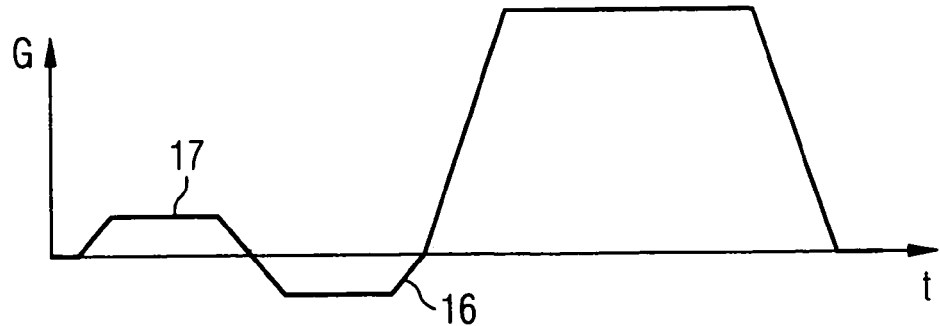
Figure 3:
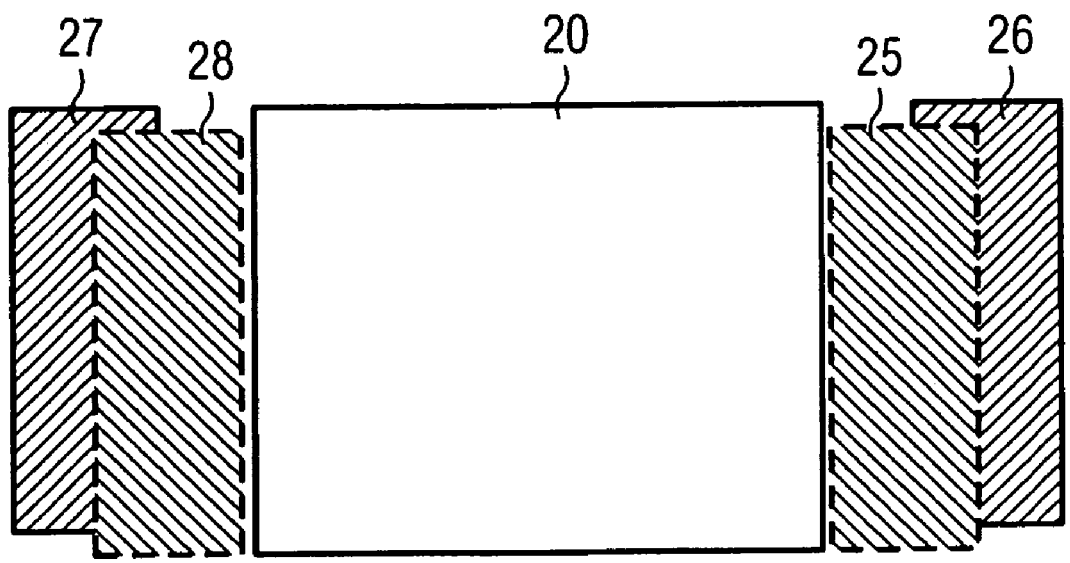
FIG. 3 shows the position of the saturation regions given switching of the magnetic field gradients according to the invention.

In connection with FIG. 3, it is now described how the sequence of FIGS. 1C and 1D prevents the saturation of signals of interest in the examination region. The polarity of the magnetic field gradient is now inventively selected dependent on the position of the region to be saturated relative to the examination region when the spectral position of saturated signal relative to the signal of interest is known. As shown in FIG. 1C, a saturation pulse 15 is switched during the negative gradient 16 in order to saturate the fat signal in the saturation region 25. The creatine signal in the region 26 is hereby saturated. Up to this point, the method coincides with the method shown in FIG. 2. In order to prevent the saturation region of the creatine 27 from being within the examination region 20, the magnetic field gradient is now reversed as the gradient switching 17 shows. The saturation pulse 18 is simultaneously switched in order to saturate the fat signals in the saturation region 28. Due to reversal of the polarity of the gradient, the saturated region of the creatine 27 now again lies further from the examination region 20 since the resonance frequency of the signal of interest (here of the creatine) is higher than that of the fat. Given the fat saturation the polarity is always selected such that the saturated regions of the other signals (which typically have a higher resonance frequency) respectively lie further outwards. In the shown embodiment, at the right edge of the examination region 20 the regions with increasing frequency must lie further to the right or, at the left edge, further to left. For this reason, the overall magnetic field (composed of the magnetic field gradient and the B0 field) must increase at the side at which the fat saturation region lies. The polarity of the gradient is thus determined by the position of the saturation region relative to the examination region and by the spectral position of the signal to be saturated.

In the form of the gradient switching selected in FIG. 1B, the saturation region is selected via selection of the frequency of both saturation pulses 11 and 14. In the case of FIGS. 1C and 1D, for example, the frequency of the saturation pulses 15 and 18 can be identical when the gradient and the examination region lie symmetrical to the magnet center.

Figure 4:
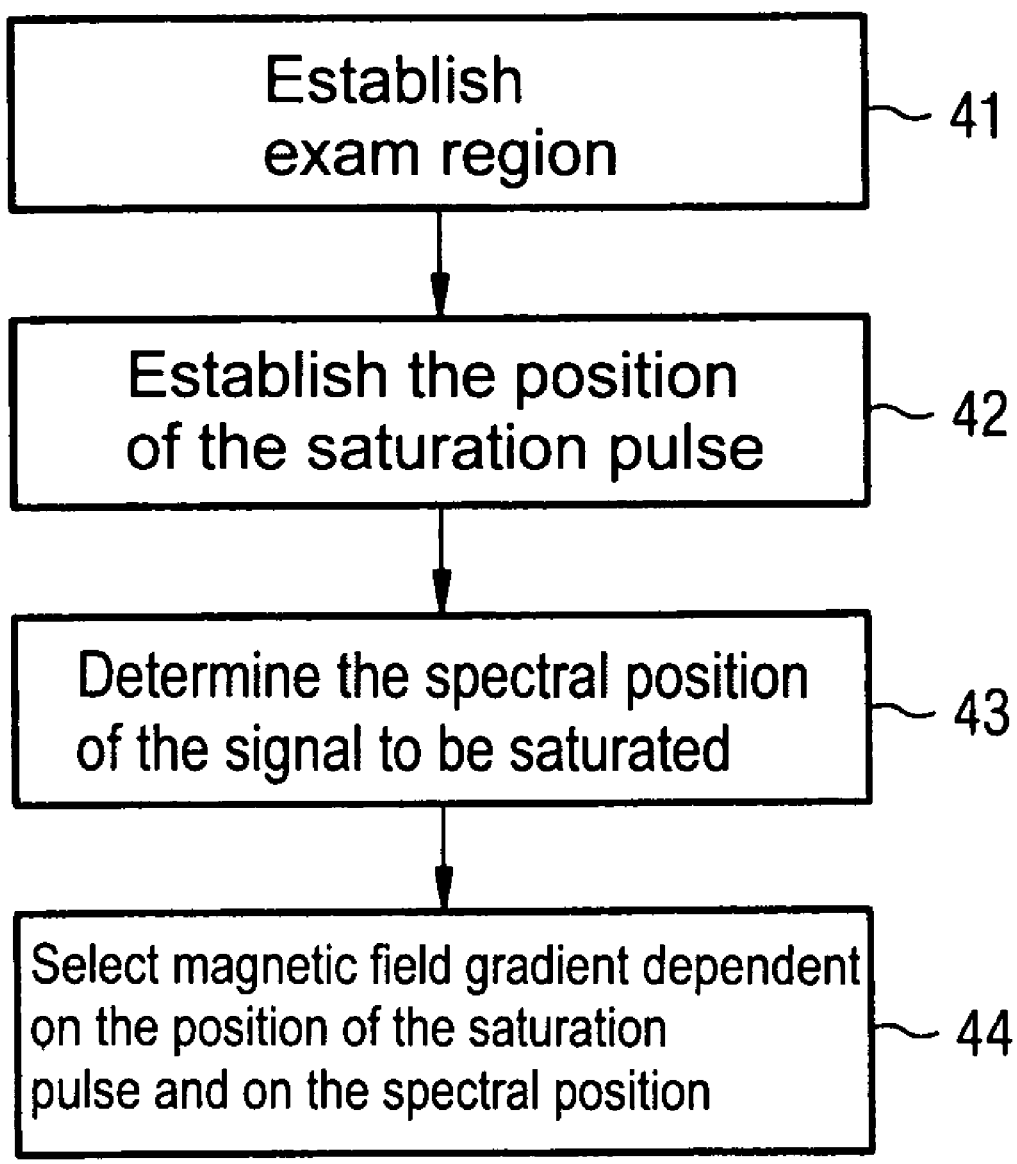
FIG. 4 is a flow chart with the steps for switching saturation pulses.

The basic steps for switching of the regional saturation pulse are shown in FIG. 4. In a first step 41, the examination region is established in which information should be acquired with the resonance spectroscopy or imaging. The positions of the saturation pulses or, respectively, saturation regions are subsequently established in a next step 42. Referring to FIGS. 2 and 3, this means that the position of the fat saturation regions 21, 22, 25, 28 is established relative to the examination region. In a next step 43 it must be established how the spectral position of the signal to be saturated is established relative to the signals of interest. If the signals to be saturated lie at one end of the spectrum, by selection of the magnetic field gradient it can be achieved that the saturation region for the signal portions of interest can be made to lie further away from the examination region than the saturation region for the signal portion to be saturated.

In step 44, the polarity of the magnetic field gradient is subsequently selected dependent on the position of the saturation pulse relative to the examination region and dependent on the spectral position of the signal to be saturated relative to the signal of interest.

Figure 5:
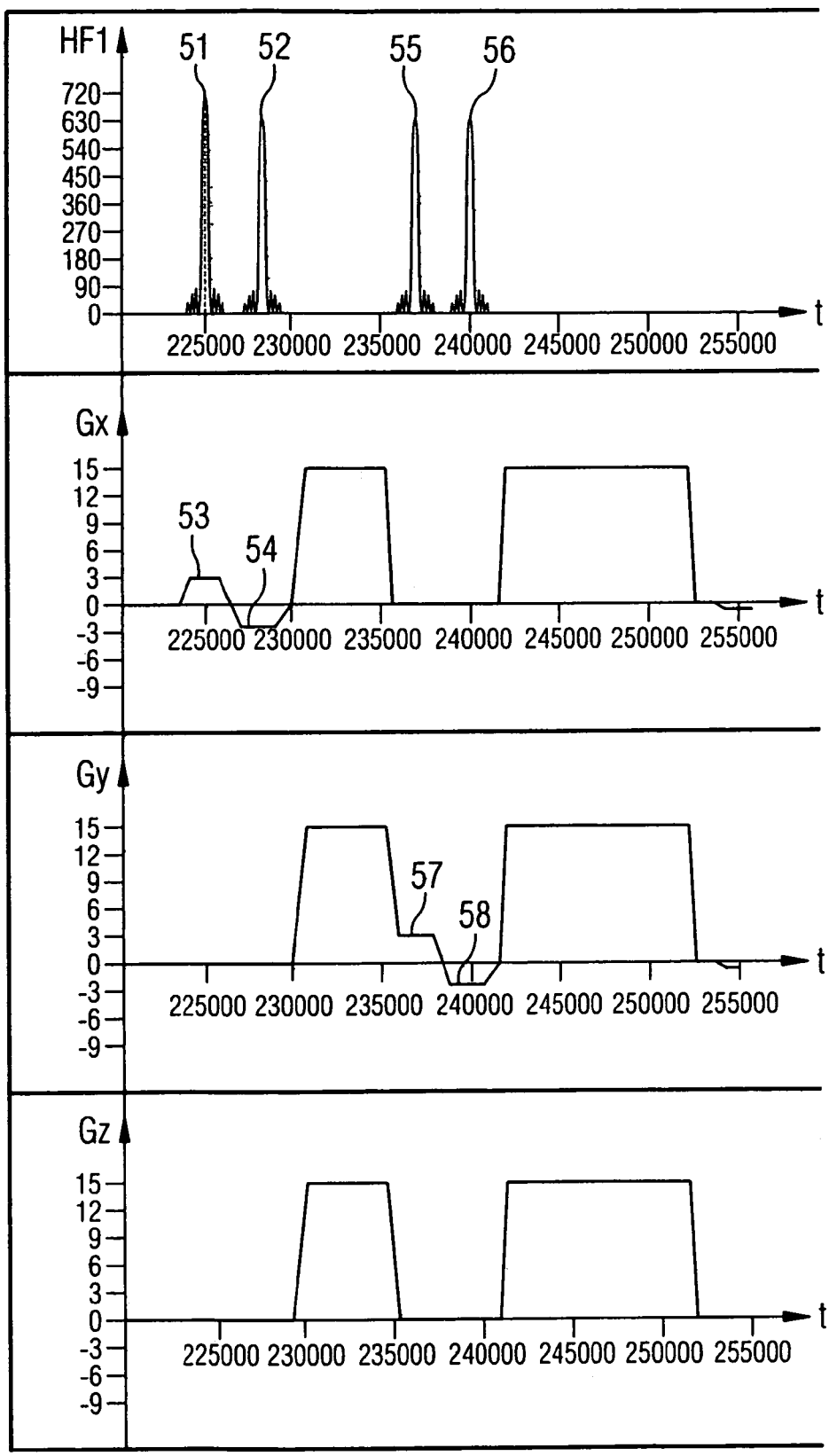
FIG. 5 shows an exemplary application case of the invention in a section of an MR spectroscopy measurement.

FIG. 5 shows an example of how the invention is applied in a spectroscopy sequence in which the saturation pulses are applied according to the invention in both dimensions x and y. A position gradient 53 and a negative gradient 54 are respectively switched during both saturation pulses 51 and 52 in order to respectively place the saturation regions for the signals of interest further outwards than the saturation regions of the fat given a fat saturation. During the saturation pulses 55 and 56, gradients of different polarity 57 and 58 are switched in the y-direction in order to place saturation pulses respectively above and below the examination region in the y-direction. Naturally, saturation pulses and corresponding gradient switches could likewise ensue in the z-direction in the event that saturation regions around the examination region in the z-direction are desired.

In summary, the present invention enables signals of unwanted nuclei to be suppressed upon switching of saturation pulses, with the signals of compounds that are of interest in the examination not being suppressed in the examination region. This is particularly advantageous given intense-field applications and given measurements with large excitation coils, particularly since localized saturation pulses are increasingly applied, for example in chemical shift imaging measurement methods.

Although modifications and changes may be suggested by those skilled in the art, it is the intention of the inventors to embody within the patent warranted hereon all changes and modifications as reasonably and properly come within the scope of their contribution to the art.

I claim as my invention:

1. A method for generating a localized saturation pulse in magnetic resonance spectroscopy or magnetic resonance imaging, comprising the steps of:

defining an examination region of subject from which desired magnetic resonance (MR) signals are to be acquired;

establishing a position of a saturation pulse relative to said examination region said saturation pulse, when activated, exciting unwanted MR signals;

determining a spectral position of an MR signal, from said examination region, that is to be saturated by said saturation pulse;

configuring a magnetic field gradient dependent on the position of the saturation pulse relative to the examination region and dependent on the spectral position of the MR signal to be saturated; and activating said saturation pulse while also activating said magnetic field gradient in said examination region to suppress contributions of said unwanted MR signals to said desired MR signals.

2. A method as claimed in claim 1 comprising determining the spectral position of the MR signal to be saturated relative to MR signals from said examination region that are of interest, and that configuring said magnetic field gradient to cause said MR signals of interest to be excited in addition to said MR signal to be saturated upon activation of said saturation pulse and said magnetic field gradient in said examination region, said MR signals of interest being spatially further removed from said examination than said MR signal to be saturated.

3. A method as claimed in claim 1 wherein the step of configuring said magnetic field gradient comprises selecting a polarity of said magnetic field gradient dependent on the position of the saturation pulse relative to the examination region and dependent on the spectral position of the MR signal to be saturated.

4. A method as claimed in claim 1 wherein the MR signal to be saturated is a fat signal, and comprising selecting the polarity of the magnetic field gradient to cause saturated regions of MR signals of interest to be further removed from said examination region than saturated region of said fat signal.

5. A method as claimed in claim 4 comprising selecting the polarity of the magnetic field gradient for saturation of said fat signal by, when said saturation region is disposed at a first side of said examination, increasing an overall magnetic field, comprised of the magnetic field gradient and a basic static magnetic field, at said first side of said examination region.

* * * * *